United States Patent [19]
Honjo

[11] Patent Number: 5,845,395
[45] Date of Patent: Dec. 8, 1998

[54] METHOD OF PRODUCING HIGH-TEMPERATURE SUPERCONDUCTOR THIN FILM DEVICE

[75] Inventor: Kazuhiko Honjo, Tokyo, Japan

[73] Assignee: NEC Corporation, Tokyo, Japan

[21] Appl. No.: 712,649

[22] Filed: Sep. 11, 1996

[30] Foreign Application Priority Data

Sep. 14, 1995 [JP] Japan ................................ 7-236489

[51] Int. Cl.⁶ .................................................. H05K 3/02
[52] U.S. Cl. ............................................. 29/896; 505/725
[58] Field of Search ................... 29/599, 846, 849; 505/725

[56] References Cited

U.S. PATENT DOCUMENTS

| | | | |
|---|---|---|---|
| 4,956,335 | 9/1990 | Agostinelli et al. | 505/725 |
| 5,326,747 | 7/1994 | Inada et al. | 505/725 X |
| 5,672,569 | 9/1997 | Nakamura et al. | |

FOREIGN PATENT DOCUMENTS

| | | |
|---|---|---|
| 3-64101 | 3/1991 | Japan . |
| 4-196601 | 7/1992 | Japan . |
| 4-373202 | 12/1992 | Japan . |
| 7-122927 | 5/1995 | Japan . |

OTHER PUBLICATIONS

K. Suzuki; "Recent Progress of High–Tc Superconductive Microwave Devices"; Technical Report of IEICE, Apr. 1995, pp. 1–6.

H. Chaloupka et al.; "Miniaturized High–Temperature Superconductor Microstrip Patch Antenna"; IEEE Transactions on Microwave Theory and Techniques, vol. 39, No. 9, Sep. 1991, pp. 1513–1521.

Research Disclosure 338110, Jun. 10, 1992.

*Primary Examiner*—Carl J. Arbes
*Attorney, Agent, or Firm*—Whitham, Curtis & Whitham

[57] ABSTRACT

A high-temperature superconductor (HTS) thin film device such as a patch antenna or a microstrip line is produced by using a substrate of a low-permittivity material such as polytetrafluoroethylene in which fine particles of glass fiber are dispersed. Initially a HTS film is deposited on a conventional MgO or $SrTiO_3$ substrate by sputtering or laser ablation. The low-permittivity substrate is bonded to the HTS film on the oxide substrate with an adhesive, and then the oxide substrate is removed by grinding or abrasion. After that the HTS film on the low-permittivity substrate is patterned. Since the low-permittivity substrate is small in the degree of wavelength shortening, current density in the HTS film reduces and therefore power loss of the device decreases.

20 Claims, 6 Drawing Sheets

METHOD OF PRODUCING HIGH-TEMPERATURE SUPERCONDUCTOR THIN FILM DEVICE

BACKGROUND OF THE INVENTION

This invention relates to a method of producing a high-temperatur superconductor (HTS) thin film device using a low-permittivity substrate. For example, the HTS thin film device may be a microstrip line or a patch antenna.

Applications of HTS thin films to microwave and milli-meterwave devices are under development. Typical examples of known HTS's are oxides containing yttrium, bismuth or thallium, such as Y—Ba—Cu—O compounds, Bi—Sr—Ca—Cu—O compounds and Tl—Sr—Ca—Cu—O compounds. A thin film of a HTS can be deposited on a dielectric substrate by sputtering or laser ablation, and the HTS film can be patterned by conventional photolithography and dry etching techniques. For the deposition of a good HTS film, the substrate material must match with the HTS in crystal lattice constants, and therefore it is usual to use either MgO or $SrTiO_3$ (STO) as the substrate material. It is possible to deposit a HTS film on each side of a substrate.

Figures 8, 9:
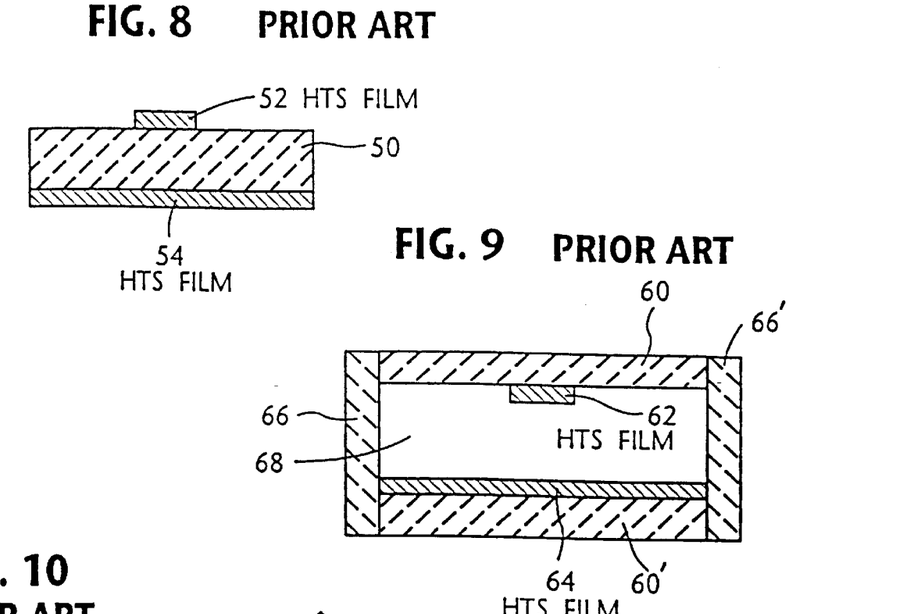
FIG. 8 is a schematic cross-sectional view of a conventional HTS thin film device.
FIG. 9 is a schematic cross-sectional view of a previously proposed HTS microstrip line.

For example, FIG. 8 shows the structure of a known HTS microstrip line. Initially a HTS film is deposited on each side of a MgO or STO substrate 50, and the HTS film 52 on one side of the substrate is patterned into the form of a microstrip conductor. The HTS film 54 on the opposite side is used as a ground conductor.

With the structure of FIG. 8, there are several problems which are fundamentally attributed to the fact that the metal oxide substrate is very high in relative permittivity, which is about 10 in the case of MgO and about 100 in the case of STO. Since lines of electric force pass through the high-permittivity substrate, the dielectric loss becomes great. Furthermore, in the high-permittivity substrate the degree of wavelength shortening is very large, so that the shortening of wavelength causes an increase in current density and a resultant increase in power loss or transmission loss.

To solve the above problems, JP-A 3-64101 shows a HTS microstrip line of the construction shown in FIG. 9. On a MgO or STO substrate 60 a HTS film 62 is patterned into the form of a microstrip conductor. On another MgO or STO substrate 60' a HTS film 64 is deposited to use as a ground conductor. By a pair of insulating side supports 66 and 66', the two substrates are held opposite to and spaced from each other such that the two HTS films 62 and 64 face each other. In this device lines of electric force pass through the air in the space 68. Therefore, the dielectric loss is very small, and problems attributed to wavelength shortening are eliminated. However, this structure is complicated and becomes large in gross size because of the spaced arrangement of the two substrates and the provision of the insulating side supports.

Figure 10:
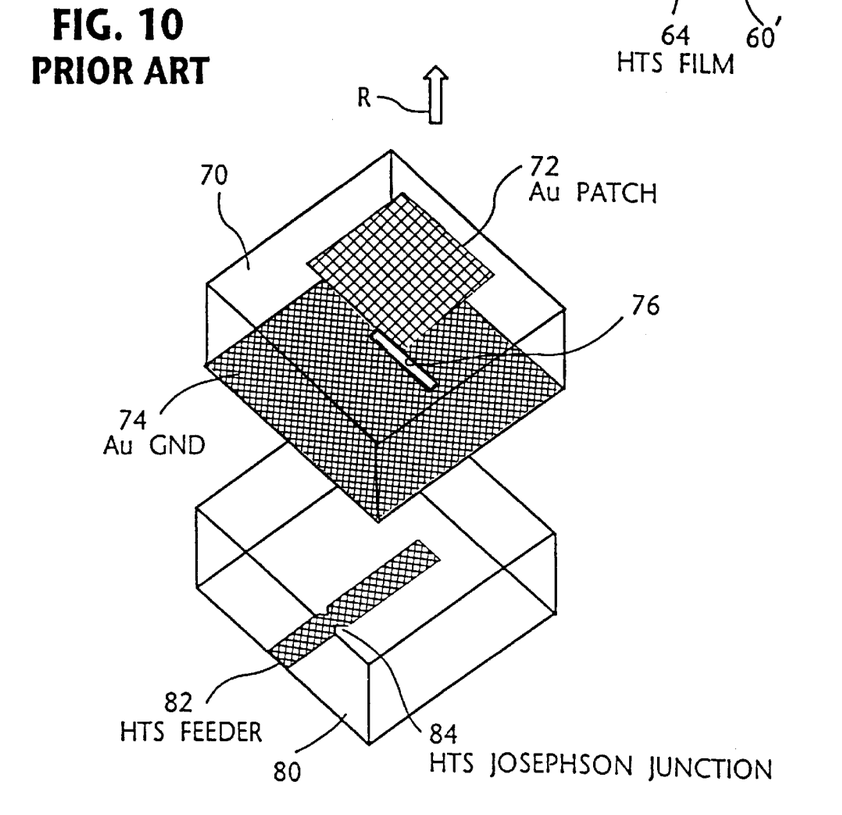
FIG. 10 is a perspective view of a previously proposed HTS patch antenna.

With respect to the application of HTS thin films to patch antennas, there is a proposal of coupling a HTS feeder-mixer part with a normal conducting radiation patch part, as shown in Technical Report of IEICE, MW95-1 (April 1995). The proposed patch antenna is shown in FIG. 10. A radiation patch 72 of Au is formed on one side of a first substrate 70 and a ground conductor 74 of Au on the opposite side. On a second substrate 80, a HTS thin film feeder 82 having a Josephson junction 84 is formed. The two substrates may be dissimilar in relative permittivity. The two substrates are arranged opposite to each other, and a small slot 76 for coupling is formed in the first substrate 70. The arrow R indicates the direction of wave radiation. This patch antenna is small in dielectric loss and power loss. However, in this antenna the low-loss characteristic inherent in HTS's is not fully utilized since a HTS is used only in the feeder-mixer part while a normal conducting metal is used in the radiation patch part.

SUMMARY OF THE INVENTION

It is an object of the present invention to provide a method of producing a HTS thin film device by using a low-permittivity substrate to reduce unfavorable effects of wavelength shortening and to decrease dielectric loss and power loss.

It is another object of the invention to provide a HTS thin film device which uses a low-permittivity substrate and is produced by a method according to the invention.

A method according to the invention comprises the steps of (a) depositing a film of a HTS on a first substrate of a first material which matches with the HTS in crystal lattice constants, (b) bonding a second substrate of a second material, which is lower in relative permittivity than the first material, to the HTS film on the first substrate to obtain a temporary laminate in which the HTS film is sandwiched between the first and second substrates, (c) removing the first substrate from the temporary laminate to expose the HTS film on the second substrate, and (d) patterning the HTS film on the second substrate.

In this method the HTS can be selected from known oxide HTS's such as Y—Ba—Cu—O compounds, Bi—Sr—Ca—Cu—O compounds and Tl—Sr—Ca—Cu—O compounds, and the first substrate material is usually MgO or STO. The deposition of a HTS film on the first substrate can be accomplished by sputtering or laser ablation.

A preferred example of the second substrate material is polytetrafluoroethylene (PTFE) in which fine particles of glass fiber are dispersed. This material will be called PTFE-GF. PTFE-GF has a relative permittivity of about 3, which is very smaller than about 10 of MgO. So, in a PTFE-GF substrate the shortening of wavelength is to the extent of about 60% of the free space wavelength, whereas in MgO and STO substrates the shortening of wavelength reaches to 10 to 30% of the free space wavelength.

Another example of the second substrate material is a polyimide.

It is impossible to directly deposit a good HTS film on a low-permittivity substrate such as a PTFE-GF substrate or a polyimide substrate. However, according to the invention a good HTS film deposited on a MgO or STO substrate is transferred onto a low-permittivity substrate by an ingenious process.

The above-stated method according to the invention can be modified, without altering the principle, in order to bond a HTS film onto one side of a low-permittivity substrate and another HTS film onto the opposite side of the substrate. The details will be described hereinafter.

For example, a HTS microstrip line or a HTS patch antenna can be produced by a method according to the invention. By virtue of using a substrate that is low in permittivity and small in the degree of wavelength shortening, the current density in the microstrip or patch antenna conductor greatly reduces and therefore the power loss or transmission loss greatly decreases.

DESCRIPTION OF THE PREFERRED EMBODIMENTS

FIGS. 1(A) to 1(D) illustrate the steps of a first method according to the invention.

Figure 1:
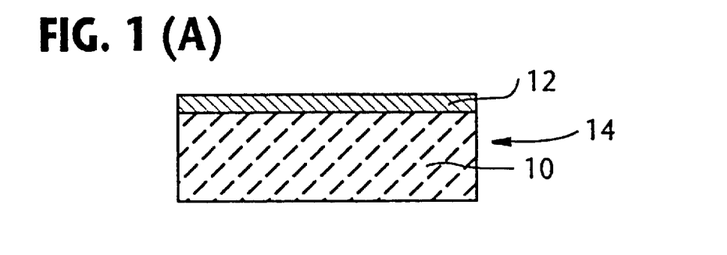
FIGS. 1(A) to 1(D) illustrate, in schematic cross-sectional views, the process of producing a HTS thin film device by a first method according to the invention.

First, as shown in FIG. 1(A), a HTS thin film 12 is deposited on a MgO (or STO) substrate 10 by a conventional technique such as sputtering or laser ablation. The product of this step will be referred to as intermediate 14.

Referring to FIG. 1(B), a PTFE-GF substrate 16 is bonded to the HTS film 12 on the intermediate 14 with an adhesive. As the result, the HTS film 12 is sandwiched between the MgO substrate 10 and the PTFE-GF substrate 16.

Next, the MgO substrate 10 is removed by grinding or abrasion to expose the HTS film 12 on the PTFE-GF susbstrate 16 as shown in FIG. 1(C). The product of this step will be referred to as intermediate 18.

Referring to FIG. 1(D), the HTS film 12 on the intermediate 18 is patterned to obtain a HTS circuit pattern 12A by the conventional steps of overlaying the HTS film 12 with a photoresist layer (not shown), patterning the resist layer by photolithography and performing dry etching of the HTS film 12 by using the patterned resist layer as mask. After that, a ground conductor 20, which is a normal conducting metal sheet, is attached to the substrate 16 on the side opposite to the HTS film 12A.

Figure 2:
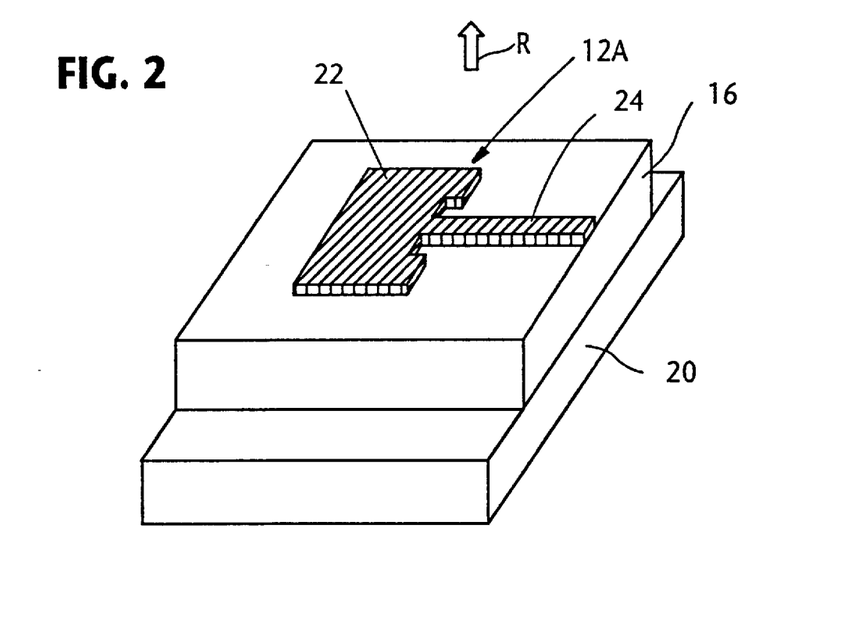
FIG. 2 is a perspective view of a HTS patch antenna produced by the method of FIGS. 1(A) to 1(D)

FIG. 2 shows a HTS patch antenna as an example of the HTS thin film device shown in FIG. 1(D). The patch antenna has a HTS patch antenna conductor 22 and a HTS feeder 24 on top of the PTFE-GF substrate 16 which is on the ground conductor 20. The combination of the patch antenna conductor 22 and the feeder 24 corresponds to the patterned HTS film 12A in FIG. 1(D). In FIG. 2, arrow R indicates the direction of wave radiation.

Compared with the conventional MgO and STO substrates, the PTFE-GF substrate 16 is very smaller in the degree of wavelength shortening. In MgO and STO substrates, the shortening of wavelength reaches to 10 to 30% of the wavelength in free space. In PTFE-GF substrates the shortening of wavelength is to the extent of about 60% of the free space wavelength. Therefore, in the HTS patch antenna of FIG. 2, the current density on the antenna conductor 22 greatly reduces. It is known that the elecrtical conductivity of HTS is expressed by a two-fluid model and is regarded as a parallel conductivity consisting of super-conductivity and normal conductivity. In other words, an equivalent circuit of HTS is a parallel circuit of a no-loss inductor and a loss-involving inductor. Therefore, at high frequencies the power loss of a HTS circuit increases with an increase in current density, in proportion to the square of current density. In the HTS patch antenna of FIG. 2, the power loss greatly decreases since the current density greatly reduces.

Figure 3:
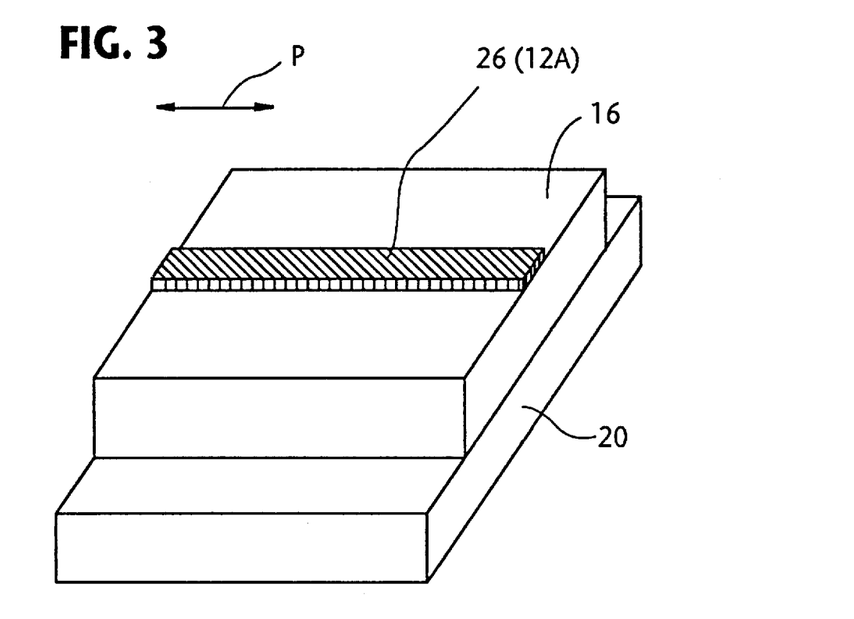
FIG. 3 is a perspective view of a HTS microstrip line produced by the method of FIGS. 1(A) to 1(D)

FIG. 3 shows a HTS microstrip line as another example of the HTS thin film device of FIG. 1(D). A HTS microstrip conductor 26 is formed on the PTFE-GF substrate 16. The microstrip conductor 26 corresponds to the patterned HTS film 12A in FIG. 1(D). Arrow P indicates the direction of signal propagation. Since the PTFE-GF substrate 16 is small in the degree of wavelength shortening, the current density in the HTS microstrip conductor 26 greatly reduces, and therefore the power loss or transmission loss greatly decreases.

FIGS. 4(A) to 4(D) illustrate the steps of a second method according to the invention.

Figure 4:
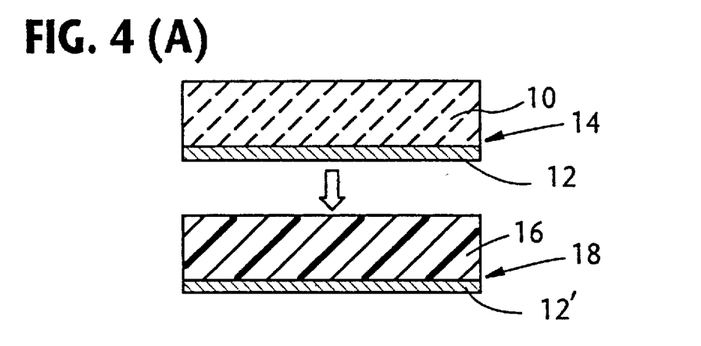
FIGS. 4(A) to 4(D) illustrate, in schematic cross-sectional views, the process of proudcing a HTS thin film device by a second method according to the invention.

Referring to FIG. 4(A), a HTS thin film 12 is deposited on a MgO (or STO) substrate 10 to obtain the intermediate 14 in FIG. 1(A). Separately, the intermediate 18 in FIG. 1(C), which has a HTS thin film 12' on a PTFE-GF substrate 16, is prepared by the process of FIGS. 1(A) to 1(C). Then, as shown in FIG. 4(B), the HTS film 12 on the intermediate 14 is bonded to the exposed side of the PTFE-GF substrate 16 of the intermediate 18 with an adhesive to obtain a temporary laminate.

Next, the MgO substrate 10 in the temporary laminate of FIG. 4(B) is removed by grinding or abrasion to expose the HTS film 12 on the PTFE-GF susbstrate 16. As the result, as shown in FIG. 4(C), the PTFE-GF substrate 16 is laid with a HTS film 12 on one side and another HTS film 12' on the opposite side.

Referring to FIG. 4(D), one of the two HTS films 12 and 12' on the PTFE-GF substrate 16 (film 12 in the illustration) is patterned to obtain a HTS circuit pattern 12A by conventional photolithography and dry etching operations. The other HTS film (12') is left unpatterned for use as a HTS ground conductor.

FIGS. 5(A) to 5(D) illustrate the steps of a third method according to the invention.

Figure 5:
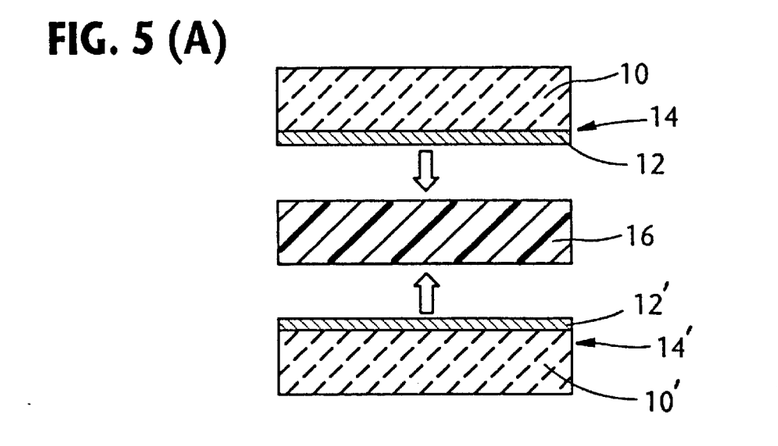
FIGS. 5(A) to 5(D) illustrate, in schematic cross-sectional views, the process of producing a HTS thin film device by a third method according to the invention.

Referring to FIG. 5(A), two similar intermediates 14 and 14' are prepared each by depositing a HTS thin film 12 or 12' on a MgO (or STO) substrate 10 or 10'. Using an adhesive, the two intermediates 14 and 14' are bonded to two opposite sides of a PTFE-GF substrate 16, respectively, such that the HTS films 12, 12' of the respective intermediates 14, 14' adhere to the PTFE-GF substrate 16 as shown in FIG. 5(B).

Next, the two MgO substrates 10 and 10' of the temporary laminate in FIG. 5(B) are removed by grinding or abrasion. As the result, as shown in FIG. 5(C), the PTFE-GF substrate 16 is laid with a HTS film 12 on one side and another HTS film 12' on the opposite side.

Referring to FIG. 5(D), one of the two HTS films 12 and 12' on the PTFE-GF substrate 16 (film 12 in the illustration) is patterned to obtain a HTS circuit pattern 12A by conventional photolithography and dry etching operations. The product shown in FIG. 5(D) is analogous to the product shown in FIG. 4(D).

Figure 6:
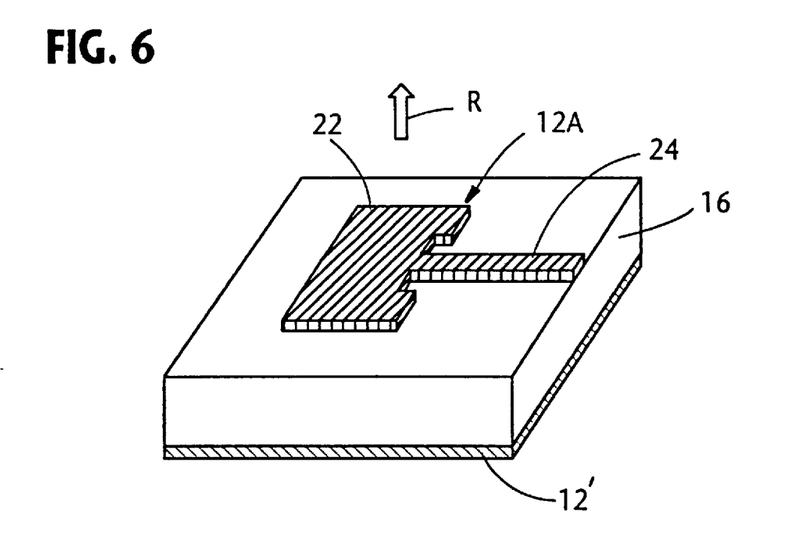
FIG. 6 is a perspective view of a HTS patch antenna produced by the method of FIGS. 4(A) to 4(D) or the method of FIGS. 5(A) to 5(D)
Figure 7:
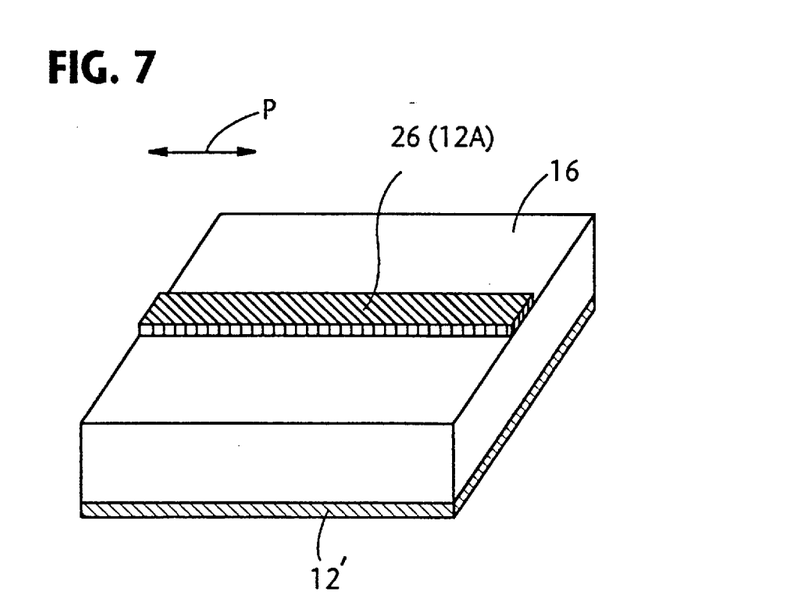
FIG. 7 is a perspective view of a HTS microstrip line produced by the method of FIGS. 4(A) to 4(D) or the method of FIGS. 5(A) to 5(D)

FIG. 6 shows a HTS patch antenna as an example of HTS thin film devices produced by the method illustrated in FIGS. 4(A) to 4(D) or the method illustrated in FIGS. 5(A) to 5(D). The HTS patch antenna of FIG. 6 is similar to the patch antenna of FIG. 2 except that the ground conductor is changed to a HTS film 12'.

As another example of the product of the method illustrated in FIGS. 4(A) to 4(D) or FIGS. 5(A) to 5(D), FIG. 7 shows a HTS microstrip line, which is similar to the microstrip line of FIG. 3 except that the ground conductor is changed to a HTS film 12'.

What is claimed is:

1. A method of producing a high-temperature superconductor thin film device, comprising the steps of:
   (a) depositing a film of a high-temperature superconductor on a first substrate of a first material which matches with the high-temperature superconductor in crystal lattice constants, said high-temperature superconductor being an oxide superconductor selected from the group consisting of Y—Ba—Cu—O compounds, Bi—Sr—Ca—Cu—O compounds and Tl—Sr—Ca—Cu—O compounds, said first material being a metal oxide;
   (b) bonding a second substrate of a second material, which is lower in relative permittivity than said first material, to said film on said first substrate to obtain a temporary laminate in which said film is sandwiched between said first substrate and said second substrate, said second material being polytetrafluoroethylene in which fine particles of glass fiber are dispersed;
   (c) removing said first substrate from said temporary laminate thereby to expose said film on said second substrate; and
   (d) patterning said film on said second substrate.

2. A method according to claim 1, wherein in step (d) said film is patterned into the form of a patch antenna conductor and a feeder.

3. A method according to claim 1, wherein in step (d) said film is patterned into the form of a microstrip line.

4. A method of producing a high-temperature superconductor thin film device, comprising the steps of:
   (a) depositing a film of a high-temperature superconductor on a first substrate of a first material which matches with the high-temperature superconductor in crystal lattice constants, said high-temperature superconductor being an oxide superconductor selected from the group consisting of Y—Ba—Cu—O compounds, Bi—Sr—Ca—Cu—O compounds and Tl—Sr—Ca—Cu—O compounds, said first material being a metal oxide;
   (b) bonding a second substrate of a second material, which is lower in relative permittivity than said first material, to said film on said first substrate to obtain a temporary laminate in which said film is sandwiched between said first substrate and said second substrate, said second material being a polyimide;
   (c) removing said first substrate from said temporary laminate thereby to expose said film on said second substrate; and
   (d) patterning said film on said second substrate.

5. A method according to claim 4, wherein in step (d) said film is patterned into the form of a patch antenna conductor and a feeder.

6. A method according to claim 4, wherein in step (d) said film is patterned into the form of a microstrip line.

7. A method of producing a high-temperature superconductor thin film device, comprising the steps of:
   (a) depositing a film of a high-temperature superconductor on a first substrate of a first material which matches with the high-temperature superconductor in crystal lattice constants;
   (b) bonding a second substrate of a second material, which is lower in relative permittivity than said first material, to said film on said second substrate to obtain a temporary laminate in which said film is sandwiched between said first substrate and said second substrate;
   (c) removing said first substrate from said temporary laminate thereby to expose said film on said second substrate;
   (d) depositing a film of said high-temperature superconductor on a third substrate of said first material;
   (e) after steps (c) and (d), bonding said film on said third substrate to said second substrate on the side opposite to the film on said second substrate to obtain another temporary laminate;
   (f) removing said third substrate from said another temporary laminate, whereby two opposite sides of said second substrate are each laid with a film of said high-temperature superconductor; and
   (g) patterning one of the two films of said high-temperature superconductor on said second substrate.

8. A method according to claim 7, wherein said high-temperature superconductor is an oxide superconductor selected from the group consisting of Y—Ba—Cu—O compounds, Bi—Sr—Ca—Cu—O compounds and Tl—Sr—Ca—Cu—O compounds, said first material being a metal oxide.

9. A method according to claim 8, wherein said metal oxide is selected from the group consisting of MgO and SrTiO$_3$.

10. A method according to claim 8, wherein said second material is polytetrafluoroethylene in which fine particles of glass fiber are dispersed.

11. A method according to claim 8, wherein said second material is a polyimide.

12. A method according to claim 7, wherein in step (g) the film is patterned into the form of a patch antenna conductor and a feeder.

13. A method according to claim 7, wherein in step (g) the film is patterned into the form of a microstrip line.

14. A method of producing a high-temperature superconductor thin film device, comprising the steps of:
   (a) depositing a film of a high-temperature superconductor on a first substrate of a first material which matches with the high-temperature superconductor in crystal lattice constants;
   (b) depositing a film of said high-temperature superconductor on a second substrate of said first material;
   (c) bonding said film on the first substrate to one side of a third substrate of a second material, which is lower in relative permittivity than said first material, and bonding said film on the second substrate to the opposite side of said third substrate to obtain a temporary laminate in which said first and second substrates constitute top and bottom layers;
   (d) removing said first and second substrates from said temporary laminate, whereby two opposite sides of said third substrate are each laid with a film of said high-temperature superconductor; and
   (e) patterning one of the two films of said high-temperature superconductor on said second substrate.

15. A method according to claim 14, wherein said high-temperature superconductor is an oxide superconductor selected from the group consisting of Y—Ba—Cu—O compounds, Bi—Sr—Ca—Cu—O compounds and Tl—Sr—Ca—Cu—O compounds, said first material being a metal oxide.

16. A method according to claim 15, wherein said metal oxide is selected from the group consisting of MgO and $SrTiO_3$.

17. A method according to claim 15, wherein said second material is polytetrafluoroethylene in which fine particles of glass fiber are dispersed.

18. A method according to claim 15, wherein said second material is a polyimide.

19. A method according to claim 14, wherein in step (e) the film is patterned into the form of a patch antenna conductor and a feeder.

20. A method according to claim 14, wherein in step (e) the film is patterned into the form of a microstrip line.

* * * * *